(12) United States Patent
Hayashi et al.

(10) Patent No.: US 7,719,322 B2
(45) Date of Patent: May 18, 2010

(54) SEMICONDUCTOR DEVICE HAVING DIFFERENTIAL SIGNAL DETECTION CIRCUIT FOR ENTRY INTO MODE OTHER THAN NORMAL OPERATION

(75) Inventors: Kentaro Hayashi, Kanagawa (JP); Yoshihiko Hori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 26 days.

(21) Appl. No.: 12/073,546

(22) Filed: Mar. 6, 2008

(65) Prior Publication Data

US 2008/0265948 A1    Oct. 30, 2008

(30) Foreign Application Priority Data

Apr. 26, 2007  (JP)  .............. 2007-116694

(51) Int. Cl.
    *H03K 5/00*  (2006.01)
(52) U.S. Cl. .................. 327/50; 327/58; 327/65
(58) Field of Classification Search .......... 327/50, 327/58, 65
    See application file for complete search history.

(56) References Cited

U.S. PATENT DOCUMENTS

| | | | |
|---|---|---|---|
| 5,491,434 A | * | 2/1996 | Harnishfeger et al. .......... 327/50 |
| 6,501,303 B1 | | 12/2002 | Suyama |
| 6,504,404 B2 | * | 1/2003 | Uchiki et al. ................. 327/65 |
| 6,550,038 B2 | | 4/2003 | Shirata |
| 6,768,352 B1 | * | 7/2004 | Maher et al. ................ 327/112 |
| 7,102,392 B2 | * | 9/2006 | Hsu et al. ..................... 327/20 |
| 2002/0046388 A1 | | 4/2002 | Shirata |

FOREIGN PATENT DOCUMENTS

JP    2000-338145    12/2000
JP    2002-123501     4/2002

* cited by examiner

*Primary Examiner*—Kenneth B. Wells
(74) *Attorney, Agent, or Firm*—McGinn IP Group, PLLC

(57) ABSTRACT

A semiconductor device includes a differential circuit for receiving a differential signal at an input terminal and a detection circuit for outputting a detection signal when a predetermined signal is inputted to the input terminal. The detection circuit detects whether the differential signal becomes outside an electric input standard and outputs the detection signal.

17 Claims, 11 Drawing Sheets

SEMICONDUCTOR DEVICE HAVING DIFFERENTIAL SIGNAL DETECTION CIRCUIT FOR ENTRY INTO MODE OTHER THAN NORMAL OPERATION

BACKGROUND OF THE INVENTION

1. Field of the Invention

The present invention relates to a semiconductor device. In particular, the present invention relates to a semiconductor device that receives and outputs low amplitude differential signals.

2. Description of Related Art

Testing of an integrated circuit (hereinafter, termed "IC") has been conducted heretofore for an improvement in the reliability and quality thereof. In a case where an IC is to be tested, a signal for switching the IC from a normal operation mode to a test mode is inputted to the IC from the outside thereof.

As a method of switching an IC from a normal operation mode to a test mode as described above, the following technique is described in Patent Documents 1 and 2. In the technique described in Patent Document 1, a voltage higher than the power supply voltage is inputted to a normally-used input/output terminal, as shown in FIG. 15. The IC is set to the test mode upon detecting a voltage higher than the power supply voltage. On the other hand, in the technique described in Patent Document 2, a terminal used for setting a test mode is additionally provided, as shown in FIG. 16. In the case of Patent Document 2, the IC is set to the test mode when a signal having a predetermined voltage is inputted to this terminal from the outside of the IC.

In the technique described in Patent Document 1, however, since the signal to be inputted has a voltage higher than the power supply voltage, there is a possibility that a voltage greater than the element breakdown voltage is inputted. For this reason, the chip size becomes larger in order to allow the element breakdown voltage to have enough margin in some cases. Moreover, in the technique described in Patent Document 2, since the terminal used for the test mode is provided, that is, since a terminal unnecessary for the normal operation is formed, the chip size eventually becomes larger.

[Patent Document 1] Japanese Patent Application Laid-open Publication No. 2000-338145

[Patent Document 2] Japanese Patent Application Laid-open Publication No. 2002-123501

As described above, in order to make the semiconductor device capable of receiving a signal for setting it to a test mode or the like, the chip size thereof becomes larger in some cases.

SUMMARY OF THE INVENTION

A semiconductor device includes a differential circuit for receiving a differential signal at an input terminal and a detection circuit for outputting a detection signal when a predetermined signal is inputted to the input terminal. Moreover, the detection circuit detects that the differential signal become outside an electric input standard and outputs the detection signal.

According to the above exemplary aspect, the operation mode of an internal circuit can be set on the basis of a voltage range of the differential signal. Accordingly, it is possible to set a test mode with a normal circuit without a need for providing a pin for setting to the test mode.

The chip size can be minimized since the signal can be inputted to the IC without newly providing an external terminal thereto, and without using a voltage equal to or greater than the power supply voltage.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Embodiment 1

Figure 1:
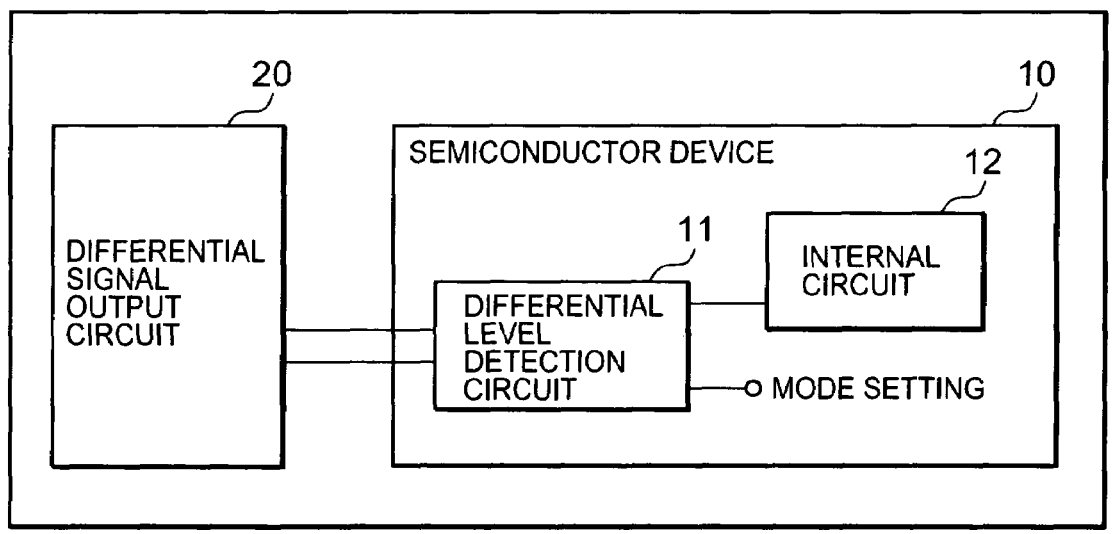
FIG. 1 is a diagram showing an overall schematic view.

FIG. 1 is a diagram showing a semiconductor device 10 and a differential signal output circuit 20 according to Embodiment 1 of the present invention. The differential signal output circuit 20 in FIG. 1 is a circuit to be embedded in a tester, for example, and outputs differential signals to a semiconductor device.

The semiconductor device 10 in FIG. 1 is an integrated circuit that operates when differential signals are inputted thereto. The semiconductor device 10 includes a differential level detection circuit 11 and an internal circuit 12. The differential level detection circuit 11 is a circuit that outputs, to the internal circuit or the like, a signal in accordance with the level of differential signals inputted to the semiconductor device. The output signal of the differential level detection circuit 11 may be a normal input signal, or a signal for setting an operation mode such as a normal operation mode or a test mode. The internal circuit 12 is a circuit that performs processing on the basis of the signals inputted to the semiconductor device 10.

Figure 2:
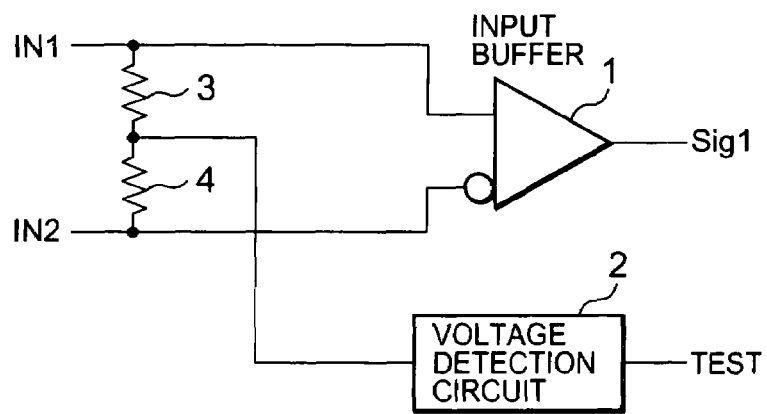
FIG. 2 is a configuration diagram showing a configuration of a test circuit according to Embodiment 1.

Descriptions will be given in more detail of the differential level detection circuit 11 of Embodiment 1 with reference to FIG. 2. As shown in FIG. 2, the differential level detection circuit 11 of Embodiment 1 includes an input buffer 1, a voltage detection circuit 2 and resistors 3 and 4. The input buffer 1 is a buffer for converting differential signals inputted to input terminals IN1 and IN2 into a single-ended signal or the like and thereafter outputting the single-ended signal. The resistors 3 and 4 are termination resistors, for example, and are connected to each other in series between the differential signal input terminals IN1 and IN2. The voltage detection circuit 2 is a circuit that detects the voltage of a node between the resistors 3 and 4. The voltage detection circuit 2 outputs a predetermined logical value in accordance with the voltage of the node between the resistors 3 and 4. In this embodiment, the resistance values of the resistors 3 and 4 are assumed to be the same, and the voltage detection circuit 2 is assumed to detect a predetermined voltage of differential signals inputted to the input terminals IN1 and IN2. It should be noted that in this embodiment, the predetermined voltage is hereinafter termed as a common voltage since the predetermined voltage is the midpoint potential between the resistors 3 and 4. In this embodiment, an output of this voltage detection circuit 2 corresponds to the signal for setting the test mode or the like.

Figure 3:
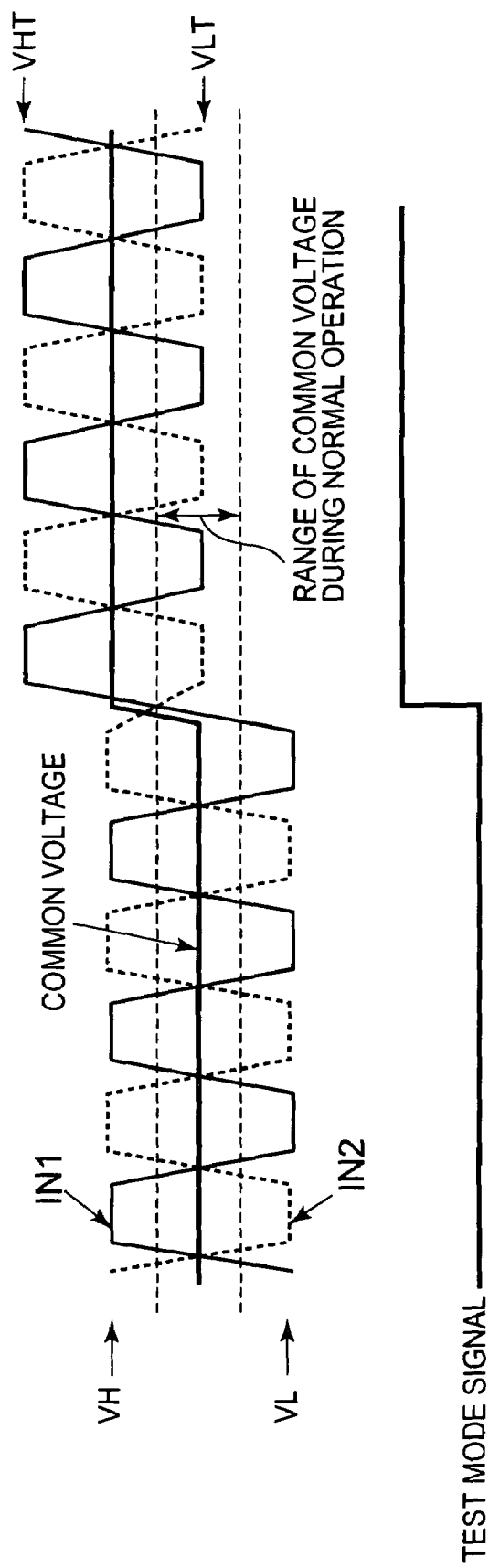
FIG. 3 is a diagram showing waveforms of an input differential signal and an output signal according to Embodiment 1.

FIG. 3 is a diagram showing input signals to the input terminals IN1 and IN2 in FIG. 2, and also an output signal of the voltage detection circuit 2. Descriptions will be hereinafter given of an operation of Embodiment 1 with reference to FIGS. 2 and 3.

In general, standard values of the differential signals to be inputted during a normal operation are defined in the semiconductor device 10. Suppose that the minimum standard value at the low voltage side is VL, and the maximum standard value at the high voltage side is VH. In this embodiment, the differential signals to be inputted are low amplitude differential signals, and a difference between VL and VH is in a range between several tens mV and several hundreds mV.

As shown in FIG. 3, the differential signal output circuit 20 outputs differential signals within the range between the aforementioned voltages of VL and VH during a normal operation. When the voltage outputted from the differential signal circuit 20 is in this range of the standard values, a common voltage detected by the voltage detection circuit 20 is also a value in the range of standard values of the common voltage (refer to the broken lines in FIG. 3). The voltage detection circuit 2 outputs a first logical value (L, for example) when the detected common voltage is within this range of the standard values of the common voltage.

When a signal outputted from the voltage detection circuit is the first logical value, the internal circuit or the like is not set to a test mode, and the semiconductor device 10 performs a normal operation. During the normal operation, a single-ended signal Sig1 or the like based on the differential signals inputted by the input buffer 1 is generated and then supplied to the internal circuit.

In order to set the semiconductor device 10 to the test mode, the differential signal output circuit 20 outputs differential signals each having a voltage different from aforementioned VL and VH. Here, the maximum value of and the minimum value of the voltage of the differential signals for setting to a test mode are set to be VHT and VLT, respectively. In a case where the maximum value and minimum value of the differential signals are changed from VH and VL to VHT and VLT, respectively, in order to set a test mode, the voltages to be inputted to the input terminals IN1 and IN2 of the differential level detection circuit 2 change as well.

Since the voltage detection circuit 2 detects the midpoint voltage of the IN1 and IN2, the common voltage to be detected also changes when the maximum value and minimum value of the voltage to be inputted to the input terminals change. In this embodiment, the test mode is entered by increasing the maximum value and the minimum value of the range of the voltage of the differential input and thereby detecting a common voltage not to be detected in a case where the differential signals within the range of the standard value are detected.

In the example shown in FIG. 3, by raising the range (the maximum value and the minimum value) of the voltage of differential signals to be inputted, a common voltage higher than the common voltage of the case where differential signals within the range of the standard values are inputted is detected. The voltage detection circuit 2 outputs a second logical value (H, for example) when a common voltage is detected as the voltage that is not a differential input within the range of the standard values. When the voltage detection circuit 2 outputs the second logical value, the test mode is set, and thereby the internal circuit or the like shifts to the test mode.

It should be noted that the difference between the maximum value VHT and the minimum value VLT of the differential signals for setting to the test mode, that is, the amplitude of the differential signals may be between several tens of mV and several hundreds of mV as in the case of the normal operation. In the semiconductor device according to the present embodiment, the test mode is detected by using a change of the midpoint voltage (common voltage) of the inputted differential signals, not by increasing the amplitude itself of the differential signals to be inputted. It is thus possible to set a test mode with a normal circuit without a need for setting the breakdown voltage of each of element circuits constituting the semiconductor device to be larger and without a need for providing the pin for setting to the test mode.

Figure 4:
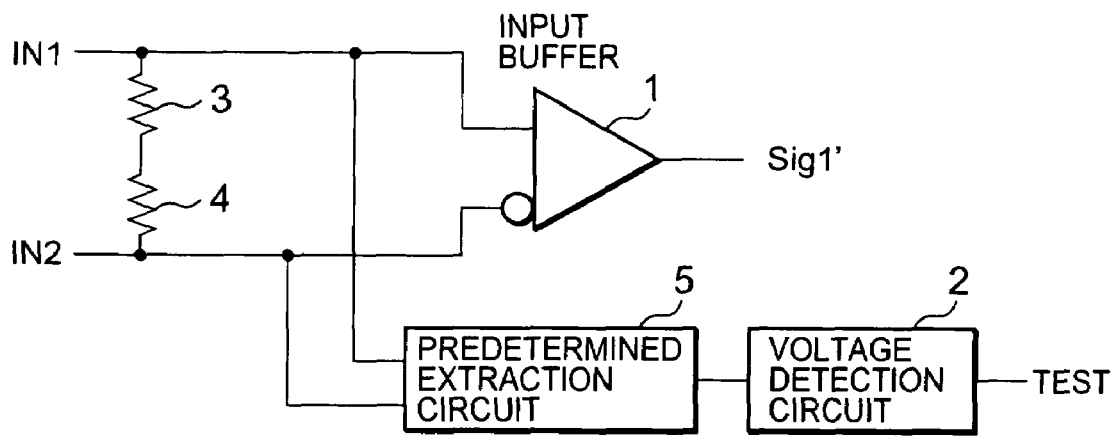
FIG. 4 is a configuration diagram showing a configuration of a test circuit according to Embodiment 1.

FIG. 4 is a diagram showing a modification example of the circuit shown in FIG. 2. The circuit shown in FIG. 4 is different from the circuit shown in FIG. 2 in that a predetermined voltage extraction circuit 5 is provided and that the predetermined voltage extraction circuit 5 measures the maximum value and the minimum value of the differential signals inputted to the input terminals IN1 and IN2. The difference between the circuit shown in FIG. 4 and the circuit shown in FIG. 2 is only that the predetermined voltage extraction circuit extracts a common voltage from the signals applied to the input terminals in the circuit shown in FIG. 4 although the common voltage is detected by measuring the midpoint voltage of the termination resistors 3 and 4 by the voltage detection circuit 2. Moreover, since the operations of the two circuits for setting to a test mode in accordance with a change in the common voltage are the same, the descriptions thereof are omitted, here.

Embodiment 2

Figure 5:
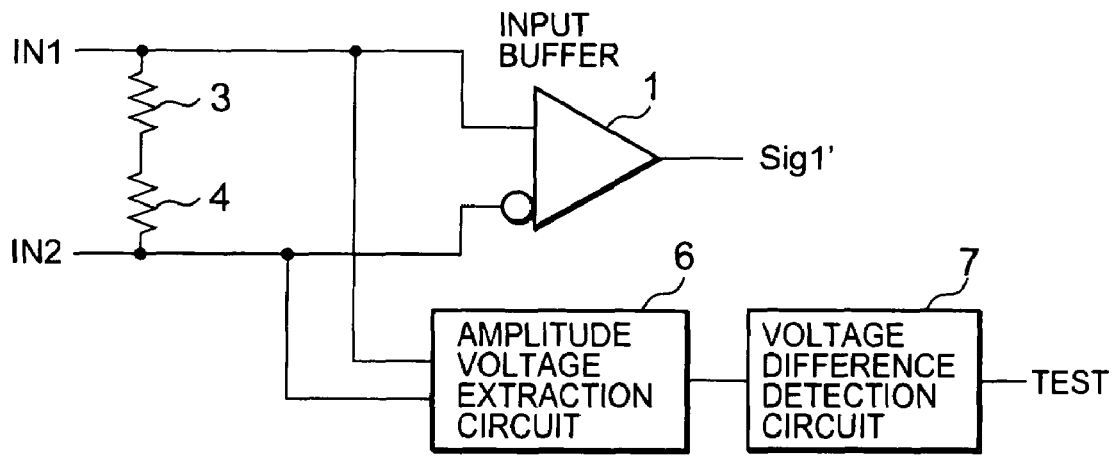
FIG. 5 is a configuration diagram showing a configuration of a test circuit according to Embodiment 2.

FIG. 5 shows a configuration of a differential level detection circuit 11 according to Embodiment 2 of the present invention. In FIG. 5, the same reference numerals are assigned to constituent elements in common with those in FIG. 2, and the descriptions thereof are omitted, here. The present embodiment is different from Embodiment 1 in that the signal for setting to a test mode or the like is outputted on the basis of the maximum voltage, the minimum voltage or the like of the inputted differential signals while the signal for setting to a test mode or the like is outputted by detecting a common voltage (predetermined voltage) in Embodiment 1. For this reason, the present embodiment is also different from Embodiment 1 in that an amplitude voltage extraction circuit 6 and a voltage difference detection circuit 7 are provided in place of the voltage detection circuit 2 in FIG. 2.

Figure 6:
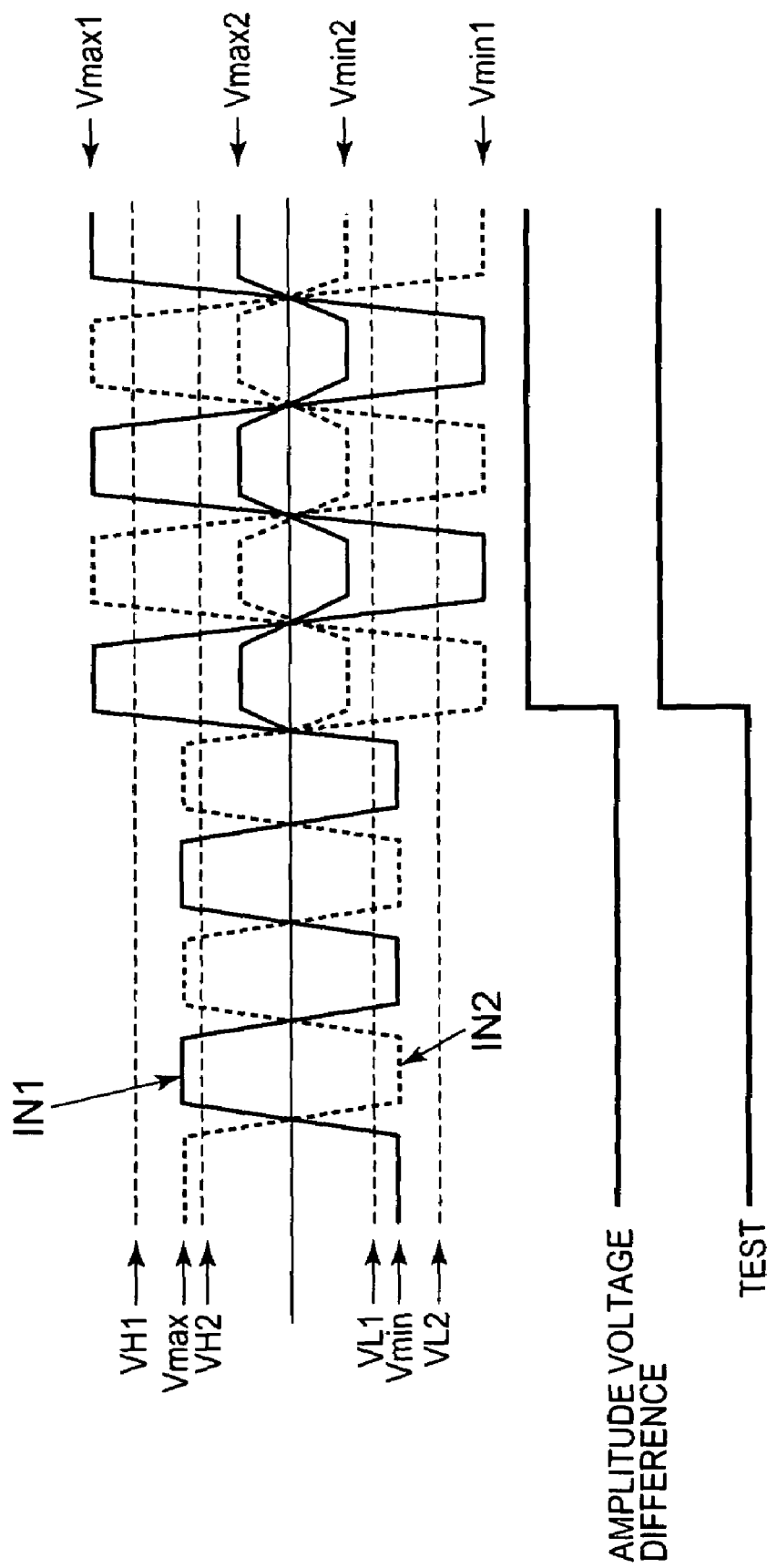
FIG. 6 is a diagram showing waveforms of an input differential signal and an output signal according to Embodiment 2.

The amplitude voltage extraction circuit 6 is a circuit that extracts the maximum value and the minimum value of the differential signals inputted to the input terminals IN1 and IN2. The voltage difference detection circuit 7 is a circuit that detects a potential difference of the maximum value or the minimum value extracted by the amplitude voltage extraction circuit 6 and that outputs the detection result. In addition, FIG. 6 is a diagram showing waveforms of input signals, a signal for setting to a test mode or the like according to the present embodiment. An operation of the present embodiment will be hereinafter described with reference to FIGS. 5 and 6.

During a normal operation, the differential signal output circuit outputs differential signals having the maximum value Vmax satisfying VH1<Vmax<VH2, and the minimum value satisfying VL1<Vmin<VL2. The amplitude voltage extraction circuit 6 extracts and outputs Vmax and Vmin of the inputted differential signals to the voltage difference detection circuit 7. The voltage difference detection circuit 7 outputs a first logical value (L, for example) if the maximum value Vmax and the minimum value Vmin of the differential signals outputted from the amplitude voltage detection circuit 6 are within the aforementioned ranges of VH1<Vmax<VH2 and VH1<Vmin<VH2, respectively. When the output of the voltage difference detection circuit is at the L level, the semiconductor device 10 is not set to a test mode, and performs a normal operation.

In order to set the semiconductor device 10 to the test mode, the differential signal output circuit 20 outputs differential signals different from aforementioned VH1<Vmax<VH2 and VL1<Vmin<VL2. Here, the maximum value and the minimum value of the differential signals for setting to the test mode are set to be Vmax1 and Vmin1, respectively. As described, in a case where the maximum value and the minimum value of the differential signals are changed from Vmax and Vmin to Vmax1 and Vmin1, respectively, in order to set the test mode, the voltages to be inputted to the input terminals IN1 and IN2 of the differential level detection circuit change as well.

Since the voltage difference detection circuit 7 detects the voltage difference of the maximum value and the minimum value, which is extracted by the amplitude voltage extraction circuit 6, the voltage difference of the maximum value and the minimum value to be detected becomes greater as the voltage difference of the maximum value and the minimum value of the voltages to be inputted to the input terminals becomes greater.

Moreover, as the voltage difference of the maximum value and the minimum value of the voltage inputted to the input terminals becomes smaller, the detected voltage difference of the maximum value and the minimum value becomes smaller as well. In this embodiment, by changing the voltage difference of the maximum value and the minimum value of the range of the voltage of the differential signals to be inputted, the test mode is entered upon detecting the voltage difference of the maximum value and minimum value of a differential signal voltage not to be detected in a case where differential signals within a predetermined range are inputted.

In the example shown in FIG. 6, the maximum voltage of the differential signals to be inputted is increased while the minimum voltage thereof is decreased, or the maximum voltage of the differential signals to be inputted is decreased while the minimum voltage thereof is increased. Specifically, in a case where VH2<Vmax1, and Vmin1<VL1, or Vmax2<VH1, and VL2<Vmin2 (refer to FIG. 6), the voltage difference detection circuit 7 outputs a second logical value (H, for example). When the voltage difference detection circuit 7 outputs the second logical value, the test mode is entered, and thereby the internal circuit or the like shifts to the test mode.

In the semiconductor device of the present embodiment, a test mode can be set in a normal circuit without a need for providing the pin for setting to the test mode.

Embodiment 3

Figure 7:
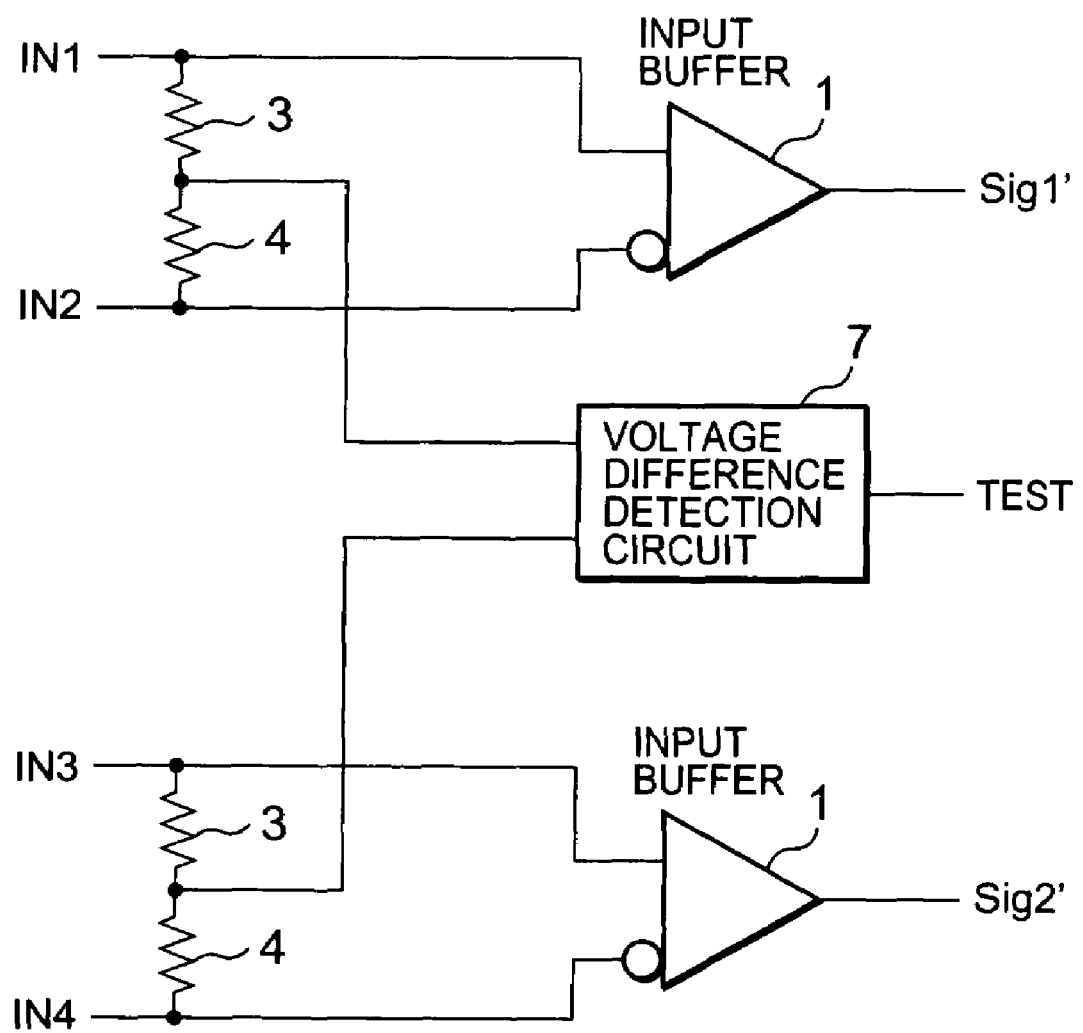
FIG. 7 is a configuration diagram showing a configuration of a test circuit according to Embodiment 3.

FIG. 7 shows a configuration of a differential level detection circuit 11 according to Embodiment 3 of the present invention. In FIG. 7, the same reference numerals are assigned to constituent elements in common with those in FIG. 2, and the descriptions thereof are omitted, here. The present embodiment is different from Embodiment 1 in that two circuits each similar to that of FIG. 2 are provided, and then, the voltages of the nodes between the resistors 3 and 4 in the respective circuits are detected by a single voltage detection circuit while the signal for setting to a test mode or the like is outputted by detecting a common voltage (predetermined voltage) in Embodiment 1. An operation of Embodiment 3 will be hereinafter described with reference to FIGS. 7 and 8

Figure 8:
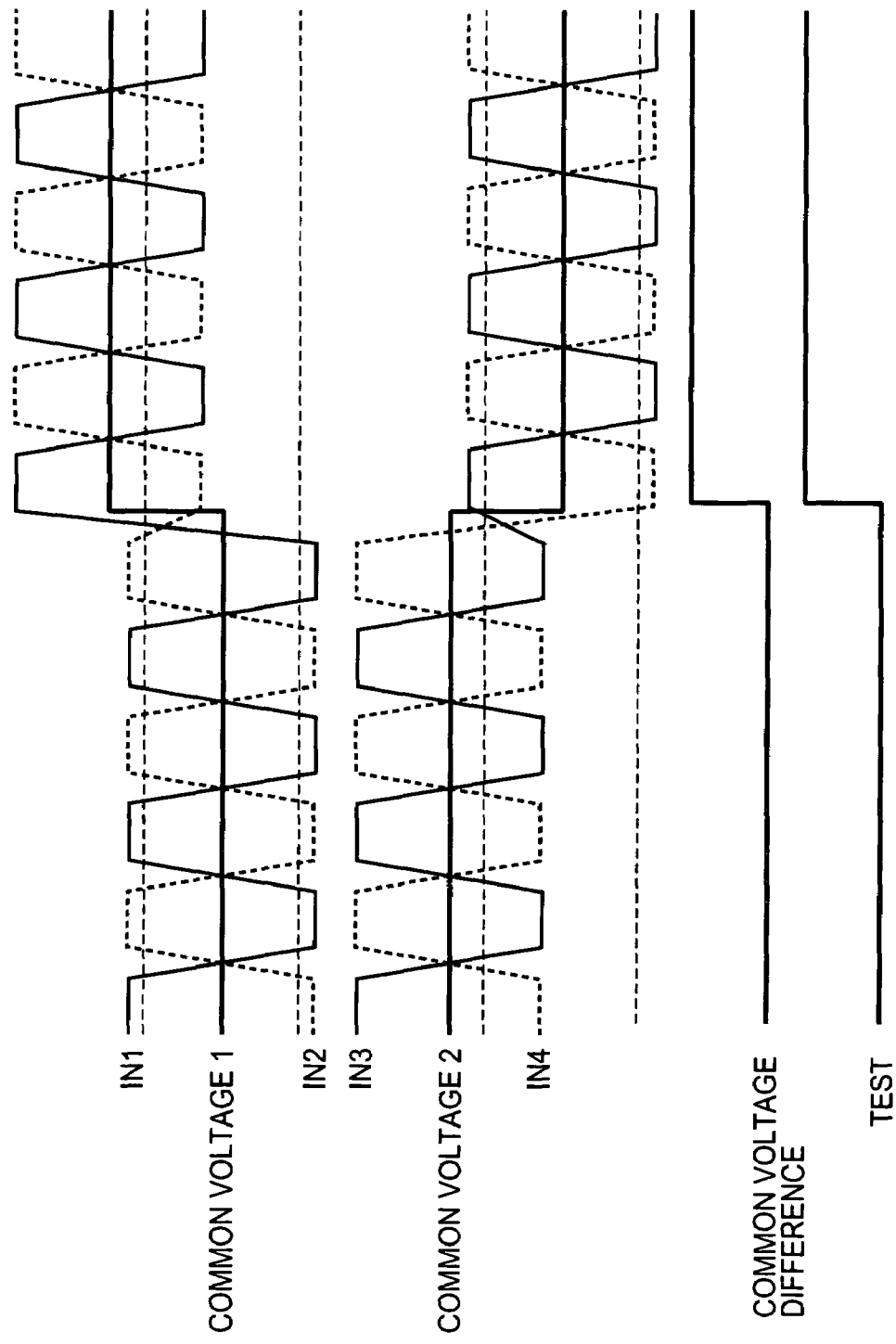
FIG. 8 is a diagram showing waveforms of an input differential signal and an output signal according to Embodiment 3.

As shown in FIG. 8, both of a common voltage 1 and a common voltage 2 have values within the range of standard values of the common voltage during a normal operation. At this time, the differential signal output circuit 20 outputs a first logical value (L, for example). When the signal outputted from the voltage difference detection circuit is the first logical value, the internal circuit or the like is not set to a test mode, and the semiconductor device 10 performs a normal operation.

In a case where the test mode is set to the semiconductor device 10, the differential signal output circuit 20 outputs differential signals having a different voltage. In the example shown in FIG. 8, as to the common voltage 1, by increasing the maximum value and the minimum value of the differential signals to be inputted, a common voltage higher than the common voltage of the case where the differential signals within the range of the standard values is detected. In the meantime, as to the common voltage 2, by decreasing the maximum value and the minimum value of the differential signals to be inputted, a common voltage lower than the common voltage of the case where the differential signals within the range of the standard values is detected. The voltage detection circuit 2 outputs a second logical value (H, for example) when the common voltages 1 and 2 are detected as the voltages that are not the differential inputs within the range of the standard values.

When the voltage detection circuit 2 outputs the second logical value, the test mode is entered, and the internal circuit or the like shifts to the test mode. In the description above, the common voltage 1 is set to a high voltage by raising the range of the voltage of the differential input (the maximum value and the minimum value), and the common voltage 2 is set to a low voltage by lowering the range of the voltage of the differential input. The voltage detection circuit thereby outputs the H level. Then, the test mode is entered on the basis of the output of this H level. However, it is also possible that the voltage detection circuit is configured to output a signal having multiple bits corresponding to multiple modes.

The aforementioned configuration enables the signal outputted by the voltage detection circuit to correspond to multiple modes, by increasing or decreasing both of the common voltages 1 and 2, or by changing only any one of the common voltage, or the like, in the differential signals outputted from the differential signal output circuit. Utilizing combinations of the increases, decreases and the like of two differential signals enables to set eight kinds of mode.

Furthermore, it is also possible to set a test mode by detecting not only a difference of two common voltages, but also a difference of more than two common voltages. In addition, although eight kinds of test mode can be set by employing the two circuits in the case of the above description, various patterns of test mode setting signals can be outputted by use of multiple differential signals.

In the semiconductor device of the present embodiment, the test mode is detected by using a change of the midpoint voltage (common voltage) of the differential signals to be inputted, not by increasing the amplitude itself of the differential signals to be inputted. It is thus possible to set the test mode with a normal circuit without a need for setting the breakdown voltage of each of element circuits constituting the semiconductor device to be larger and without a need for providing the pin for setting to the test mode.

Figure 9:
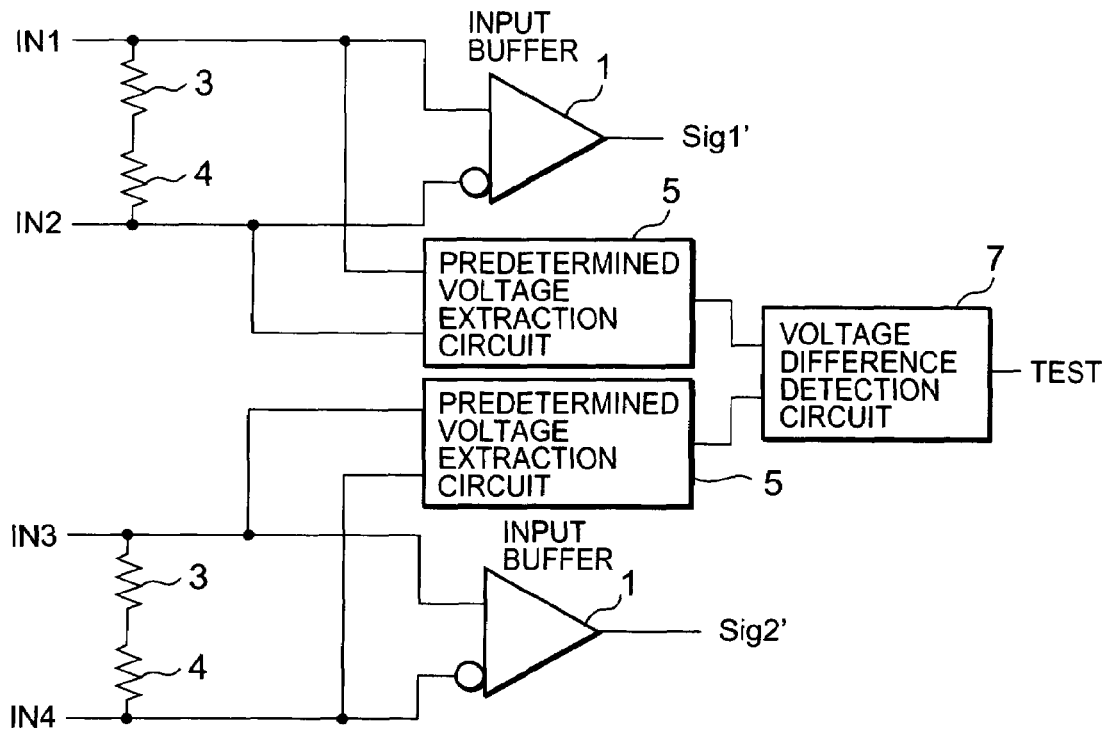
FIG. 9 is a configuration diagram showing a configuration of a test circuit according to Embodiment 3.

FIG. 9 is a diagram showing a modification example of the circuit shown in FIG. 7. In this modification example, the same modification as that made in FIG. 4 from FIG. 2 is made. Specifically, the circuit shown in FIG. 9 is only different from the circuit in FIG. 7 in that each predetermined voltage extraction circuit 5 extracts a common voltage from the signals applied to the corresponding input terminals. Since the operation to set the test mode in accordance with a change in a common voltage is the same as that in FIG. 7, the description thereof is omitted here.

Embodiment 4

Figure 10:
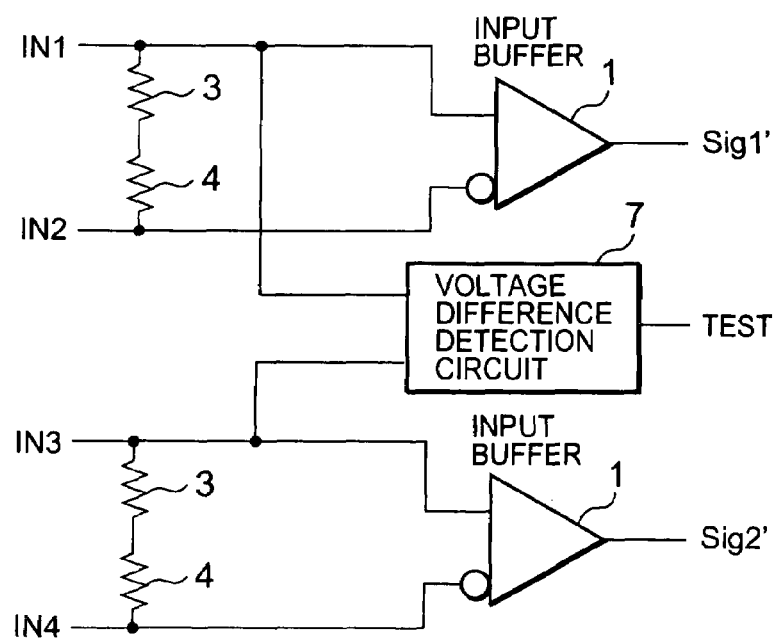
FIG. 10 is a configuration diagram showing a configuration of a test circuit according to Embodiment 4.
Figure 11:
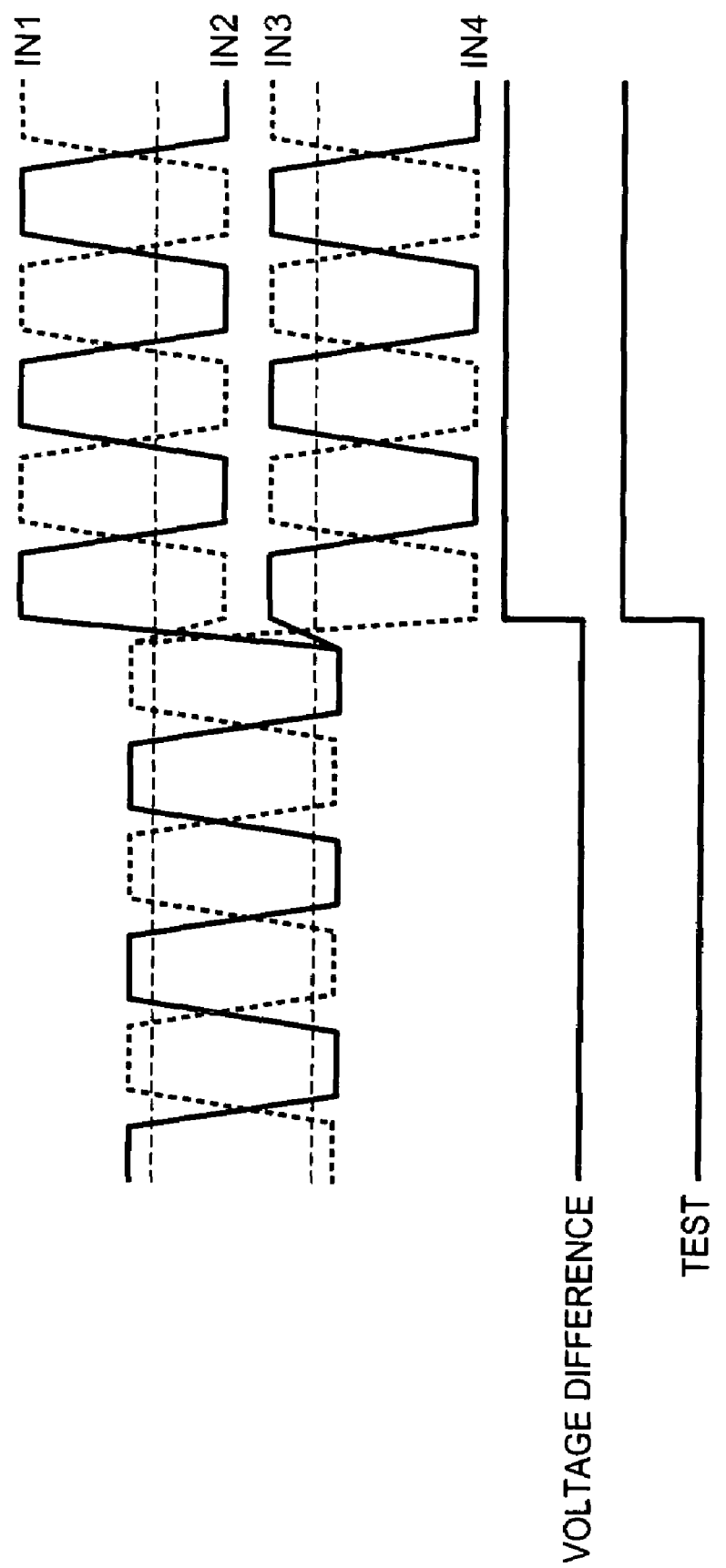
FIG. 11 is a diagram showing waveforms of an input differential signal and an output signal according to Embodiment 4.

FIG. 10 shows a configuration of a differential level detection circuit 11 according to Embodiment 4 of the present invention. In FIG. 10, the same reference numerals are assigned to constituent elements in common with those in FIG. 2, and the descriptions thereof are omitted, here. While a signal for setting to a test mode or the like is outputted on the basis of the maximum voltage and the minimum voltage of the inputted differential signals in Embodiment 2, in the present embodiment, two similar circuits are provided as in the case of Embodiment 3, and then, a difference of the maximum voltage and the minimum voltage of the signal applied to the input terminals of each circuits is detected by the voltage difference detection circuit. Descriptions will be hereinafter given of an operation of Embodiment 4 with reference to FIGS. 10 and 11. It should be noted that since the details of the operation is the same as that in FIG. 5, the description thereof is omitted, here.

As shown in FIG. 10, differential signals each having the same maximum value, minimum value, and amplitude phase (refer to broken lines in FIG. 11) to be inputted respectively to the input terminals IN1 and IN3 are inputted to the voltage difference detection circuit during a normal operation. At this time, the differential signal output circuit outputs a first logical value (L, for example). If the signal outputted from the voltage difference detection circuit is the first logical value, a test mode is not set to the internal circuit or the like, and the semiconductor device 10 performs a normal operation.

In a case where a test mode is set to the semiconductor device 10, the differential signal output circuit 20 outputs differential signals having a different voltage. In the example shown in FIG. 10, the voltage of the differential signal to be applied to the input terminal IN1 is increased, and the voltage of the differential signal to be applied to the input terminal IN3 is decreased. The voltage difference detection circuit outputs a second logical value (H, for example) when the difference of the voltages at this time becomes equal to or greater than a predetermined value. When the voltage difference detection circuit outputs the second logical value, the test mode is entered, and the internal circuit or the like shifts to the test mode.

The semiconductor device of the present embodiment can be set to a test mode with a normal circuit without a need for providing the pin for setting to the test mode. Although the differences between the differential signal inputs 1 and 3, and between the differential signal inputs 2 and 4 are detected, and used for switching to the test mode in the present embodiment, it is also possible to detect a difference between each pair of IN1, IN2, IN3 and IN4.

Figure 12:
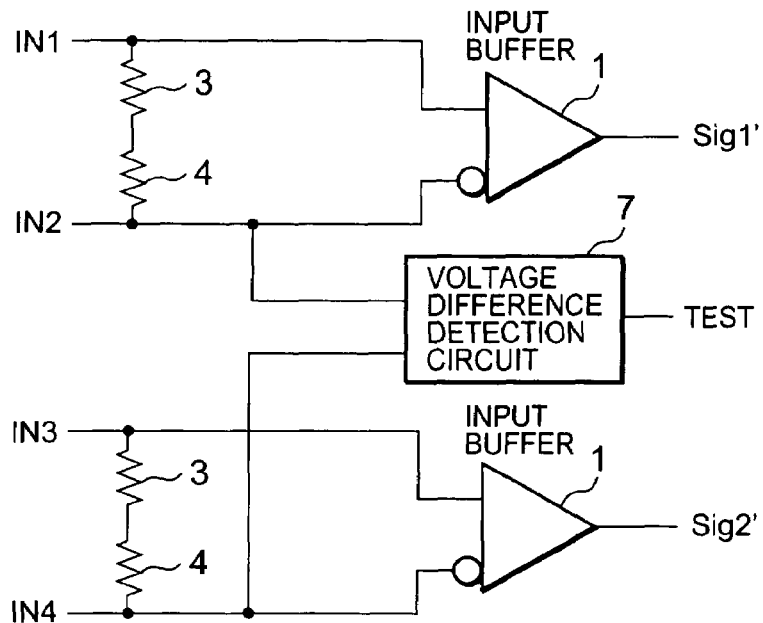
FIG. 12 is a configuration diagram showing a configuration of a test circuit according to Embodiment 4.

FIG. 12 is a diagram showing a modification example of the circuit shown in FIG. 10. The circuit shown in FIG. 12 is only different from the circuit in FIG. 10 in that the voltage difference between the voltages of the differential signals applied to the input terminals IN2 and IN4 is detected by the voltage difference detection circuit 7 while the voltage difference between the voltages of the differential signals applied to the input terminals IN1 and IN3 is detected by the voltage difference detection circuit in the circuit shown in FIG. 10. Moreover, since the operations to set a test mode in accordance with the voltage difference are the same, the description thereof is omitted, here.

Embodiment 5

Figure 13:
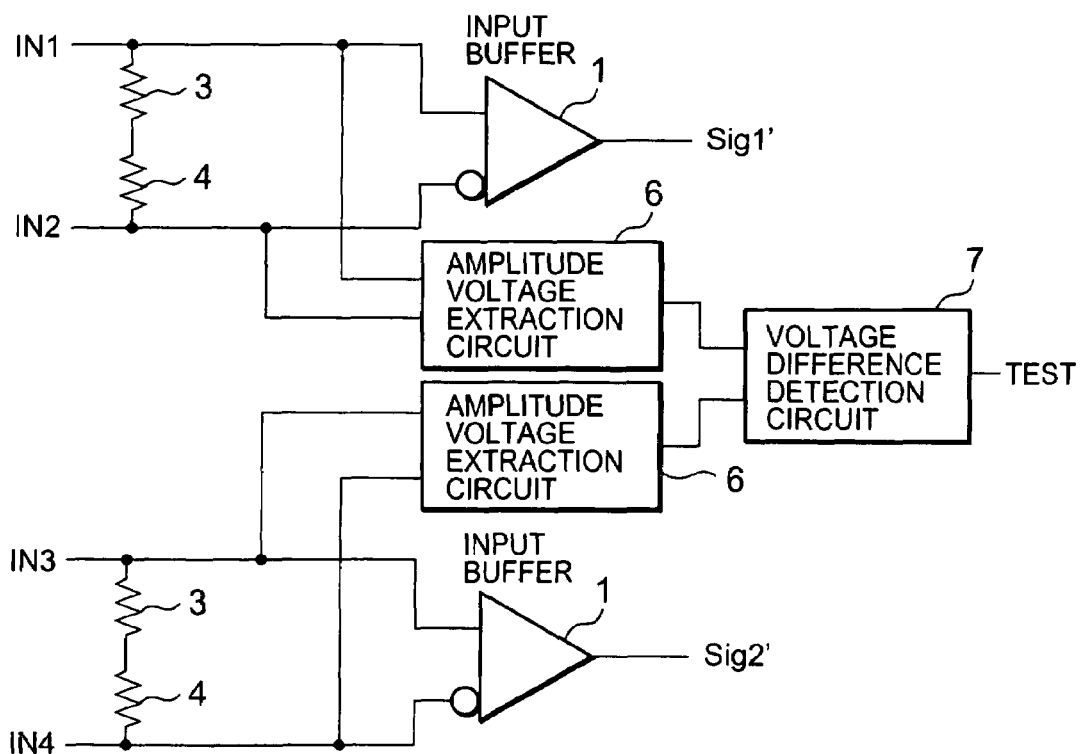
FIG. 13 is a configuration diagram showing a configuration of a test circuit according to Embodiment 5.
Figure 14:
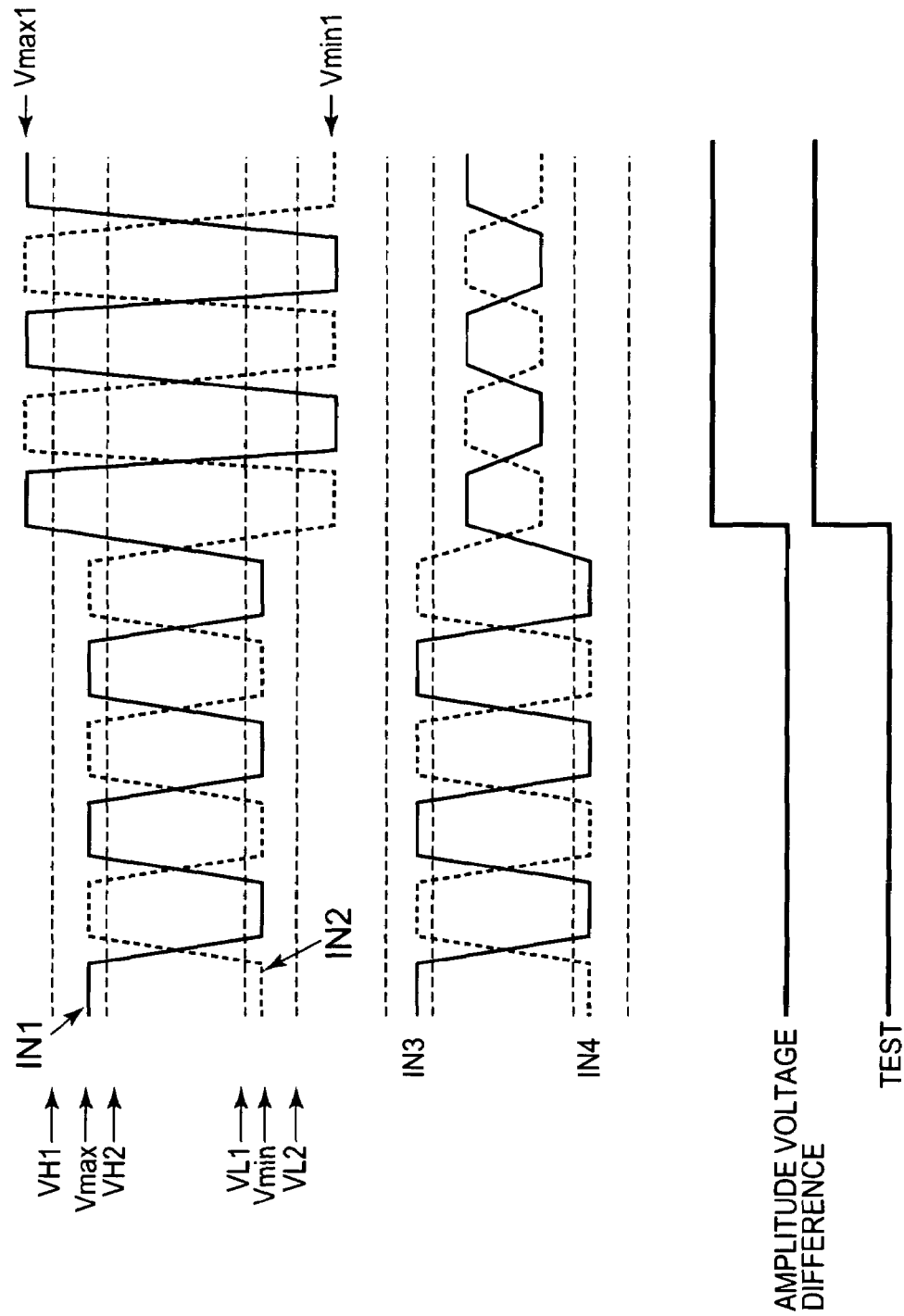
FIG. 14 is a diagram showing waveforms of an input differential signal and an output signal according to Embodiment 3.
Figure 15:
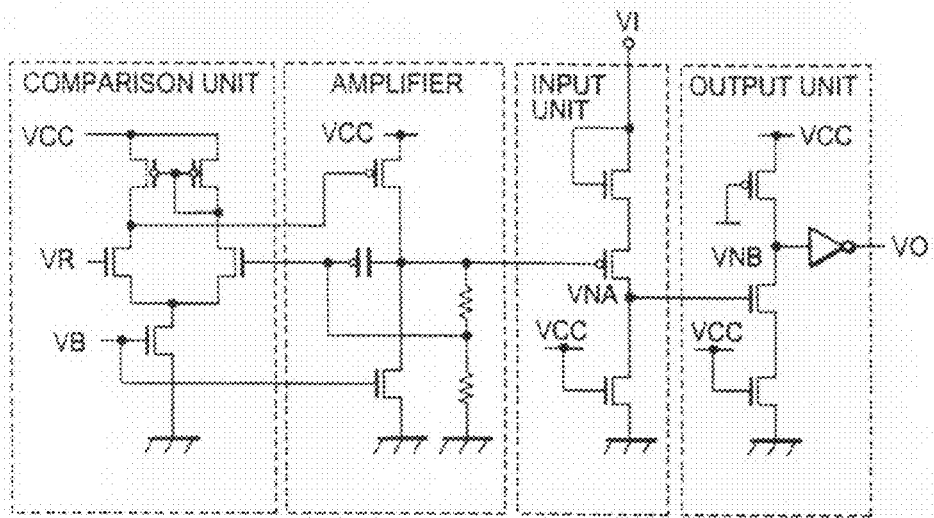
FIG. 15 is a configuration diagram showing a configuration of a conventional test circuit.
Figure 16:
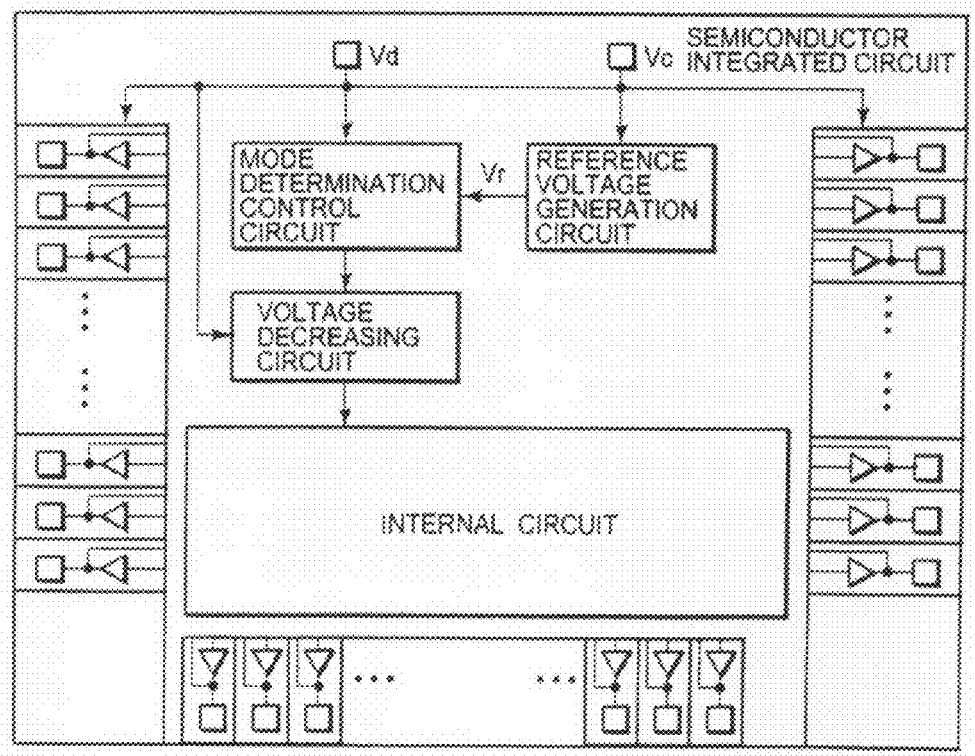
FIG. 16 is a configuration diagram showing a configuration of a conventional test circuit.

FIG. 13 shows a configuration of a differential level detection circuit 11 according to Embodiment 5. In FIG. 13, the same reference numerals are assigned to constituent elements in common with those in FIG. 2, and the descriptions thereof are omitted here. In addition, the present embodiment is different from Embodiment 3 in that a signal for setting to a test mode or the like is outputted on the basis of the voltage differences between the maximum voltages of and minimum voltages of the inputted differential signals although a signal for setting to a test mode or the like is outputted by detecting common voltages (predetermined voltages) of the respective two circuits in Embodiment 3. An operation of Embodiment 5 will be hereinafter described with reference to FIGS. 13 and 14.

During a normal operation, the differential signal output circuit outputs differential signals having the maximum value Vmax satisfying VH1<Vmax<VH2, and the minimum value Vmin satisfying VL1<Vmin<VL2. Each of the amplitude voltage extraction circuits 6 detects and then outputs, to the voltage difference detection circuit 7, Vmax and Vmin of the differential signals inputted from the corresponding circuit. The voltage difference detection circuit 7 outputs a first logical value (L, for example) if the maximum value Vmax and the minimum value Vmin of the differential signals outputted from each amplitude voltage extraction circuit 6 are within the aforementioned ranges of VH1<Vmax<VH2 and VH1<Vmin<VH2, respectively. When the output of the voltage difference detection circuit is at the L level, the semiconductor device 10 is not set to a test mode, and performs a normal operation.

In order to set the semiconductor device 10 to the test mode, the differential signal output circuit 20 outputs the differential signals having a voltage difference different from the aforementioned range VH1<Vmax<VH2 and VL1<Vmin<VL2. Here, the maximum value and the minimum value of the differential signals in each of the circuits for setting to the test mode is set to be Vmax1 and Vmin2, respectively. As described, in a case where the maximum value and the minimum value are changed from Vmax to Vmax1 and from Vmin to Vmin 2, respectively, the voltage differences to be inputted to the input terminals IN1 and IN2 of the differential level detection circuit change as well.

Since the voltage difference detection circuit 7 detects the maximum value and the minimum value, which are extracted by each of the amplitude voltage extraction circuits 6, the voltage difference of the maximum value and the minimum value to be detected change as the voltage difference of the maximum value and the minimum value in the range of the voltage to be inputted to the input terminals changes. In this embodiment, by changing the maximum value and the minimum value in the range of the voltage of the differential signals to be inputted, the test mode is entered upon detecting the maximum value and minimum values of a differential signal voltage not to be detected in a case where the differential signals within a predetermined rang are inputted. Since the details of the operation are same as those of Embodiments 2 and 3, the descriptions thereof are omitted here.

In the present embodiment, the test mode is entered when the voltage differences between the differential signals 1 and the differential signals 2 reach a voltage difference level outside the standard range. Here, the differential signals 1 are inputted to the input terminals IN1 and IN2, and the differential signals 2 are inputted to the input terminals IN3 and IN4. However, it is also possible to set the test mode when only any one of the voltage differences changes to the voltage level outside the standard range. In addition, as in the case of Embodiment 3, eight kinds of test modes can be set. In the aforementioned case, eight kinds of test mode can be set by employing the two circuits. However, various patterns of test mode setting signals can be outputted by use of multiple differential signals.

Although the embodiments of the present invention have been described in detail, various modifications can be made without departing from the spirit of the invention. In the examples, the descriptions are given as to the setting to a test mode. The present invention can be, however, used for other applications.

The present invention can be used for switching between a plurality of test modes, or for setting up data on a built-in electrically erasable programmable ROM (EEPROM), for example. The EEPROM data can be used for individual setting values, factory setting values or the like. In addition, in a case where an input differential signal is a value outside the standard range during a normal operation, the detection circuit can find the signal, and then an alarm can be issued.

Further, the embodiments can be used for a display system, which has a display controller and a display driver. The display controller includes, for example, a differential signal output circuit 20 in FIG. 1 and outputs a differential signal in response to an image data and a clock signal. The display driver receives the differential signal and outputs image signal based on the differential signal by an image processing operation to drive a display panel. The display driver includes the internal circuit 12 and the differential level detection circuit 11 as shown in FIGS. 1, 4, 5 and so on. In response to a test mode entry request, the controller outputs the differential signal having a special state outside the input regulation. The driver receives and detects the special state and produce a signal indicating a mode rather than a normal mode, for example, a test mode. For example, based on the test signal, the driver sets the condition or configuration thereof for a test.

Moreover, in the aforementioned differential level detection circuit, in a case where a nonstandard signal is inputted, the input result of the differential signal can be transmitted to the internal circuit by appropriately setting the constant of the detection circuit and the standard of the nonstandard signal.

Further, it is noted that, Applicant's intent is to encompass equivalents of all claim elements, even if amended later during prosecution.

What is claimed is:

1. A semiconductor device, comprising:
a plurality of input terminals which receive a differential signal;
a differential circuit coupled to said input terminals to receive said differential signal; and
a detection circuit which outputs a detection signal, and changes a level of the detection signal when said differential signal having a predetermined state is inputted to the input terminals,
wherein the detection circuit includes a first node directly connected to a first input terminal of the input terminals and a second node directly connected to a second input terminal of the input terminals without intervening resistors provided for producing a common level.

2. The semiconductor device according to claim 1, wherein the differential circuit operates within a predetermined range of an electric input value, and the detection circuit changes a logic state of the detection signal from a first logic state to a second logic state upon detecting that the differential signal falls outside the range.

3. The semiconductor device according to claim 2, wherein the detection signal comprises a signal for setting an operation mode of an internal circuit.

4. The semiconductor device according to claim 2, wherein said differential circuit is operable in accordance with said differential signal outside the range.

5. The semiconductor device according to claim 2, wherein said detection circuit detects an amplitude of a voltage of the differential signal.

6. The semiconductor device according to claim 5, wherein the detection circuit is directly connected to said input first and second terminals constituting a pair input terminals receiving the differential signal.

7. The semiconductor device according to claim 2, wherein said detection circuit detects a difference between a signal on the first input terminal of a first pair of said input terminals and a signal on the second input terminal of a second pair of said input terminals.

8. The semiconductor device according to claim 2, wherein said detection circuit detects an amplitude of the differential signal within the range at a second pair of said input terminals while detecting an amplitude of the differential signal outside the range at a first pair of said input terminals.

9. The semiconductor device according to claim 8, wherein said detection circuit receives an amplitude voltage at one of said first pair and an amplitude voltage at one of said second pair.

10. The semiconductor device according to claim 2, wherein said detection circuit detects a difference between an amplitude of a first pair of the input terminals and an amplitude of a second pair of the input terminals.

11. The semiconductor device according to claim 10, wherein said detection circuit detects the amplitude of the differential signal within the range at said second pair of said input terminals while detecting the amplitude of the differential signal outside the range at said first pair of said input terminals.

12. The semiconductor device according to claim 10, wherein said detection circuit receives an amplitude voltage at one of said first pair and an amplitude voltage at one of said second pair.

13. The semiconductor device of claim 1, further comprising:
   a plurality of resistors provided between the input terminals and free from the detection circuit.

14. A semiconductor device, comprising:
   a plurality of input terminals which receive a differential signal;
   a differential circuit coupled to said input terminals to receive said differential signal; and
   a detection circuit which outputs a detection signal, and changes a level of the detection signal when said differential signal having a predetermined state is inputted to the input terminals,
   wherein said detection circuit detects a difference between midpoint voltages of a first pair of the input terminals and a second pair of the input terminals.

15. A semiconductor device, comprising:
   a plurality of input terminals which receive a differential signal;
   a differential circuit coupled to said input terminals to receive said differential signal; and
   a detection circuit which outputs a detection signal, and changes a level of the detection signal when said differential signal having a predetermined state is inputted to the input terminals,
   wherein said detection circuit receives a midpoint voltage of the differential signal within a range at a second pair of said input terminals while receiving a midpoint voltage of the differential signal outside the range at a first pair of said input terminals.

16. A semiconductor device, comprising:
   a first pair of input terminals which receive a first differential signal;
   a second pair of input terminals which receive a second differential signal;
   a first differential circuit coupled to the first pair of input terminals to receive the first differential signal;
   a second differential circuit coupled to the second pair of input terminals to receive the second differential signal; and
   a detection circuit which includes a first input node directly connected to an input terminal of the first pair of input terminals and a second input node directly connected an input terminal of the second pair of input terminals to output a detection signal without intervening resistors for producing a common level,
   wherein a level of the detection signal is changed when one of the first and second differential signals having a predetermined state is inputted to the respective input terminals.

17. The semiconductor device of claim 16, further comprising:
   a first plurality of resistors provided between the first pair of input terminals and free from the detection circuit; and
   a second plurality of resistors provided between the second pair of input terminals and free from the detection circuit.

* * * * *